(12) United States Patent
Huang

(10) Patent No.: US 9,668,370 B1
(45) Date of Patent: May 30, 2017

(54) DOOR OF ELECTRONIC DEVICE

(71) Applicant: GETAC TECHNOLOGY CORPORATION, Hsinchu County (TW)

(72) Inventor: Tzu-Chiu Huang, Taipei (TW)

(73) Assignee: Getac Technology Corporation, Hsinchu County (TW)

( * ) Notice: Subject to any disclaimer, the term of this patent is extended or adjusted under 35 U.S.C. 154(b) by 0 days.

(21) Appl. No.: 15/140,335

(22) Filed: Apr. 27, 2016

(51) Int. Cl.
*H05K 5/06* (2006.01)
*G06F 1/16* (2006.01)
*H05K 5/03* (2006.01)
*H05K 5/02* (2006.01)

(52) U.S. Cl.
CPC ............. *H05K 5/03* (2013.01); *G06F 1/1656* (2013.01); *H05K 5/0217* (2013.01); *H05K 5/0239* (2013.01); *H05K 5/061* (2013.01)

(58) Field of Classification Search
CPC ...... H05K 5/03; H05K 5/0217; H05K 5/0239; H05K 5/061; G06F 1/1656
USPC .................................................... 361/679.57
See application file for complete search history.

(56) References Cited

U.S. PATENT DOCUMENTS

| 5,255,965 | A * | 10/1993 | Chen | ...................... A47B 81/06 16/260 |
| 5,650,591 | A * | 7/1997 | Matsushita | ......... B60R 16/0239 174/17 CT |
| 6,452,788 | B1 * | 9/2002 | Crowley | .................. G06F 1/181 312/223.2 |
| 7,789,437 | B2 * | 9/2010 | Sheng | ................... G06F 1/1658 292/137 |
| 8,089,757 | B2 * | 1/2012 | Chen | ..................... G06F 1/1626 174/66 |
| 8,139,364 | B2 * | 3/2012 | Wickett | ............... H05K 5/0039 174/50 |
| 8,434,833 | B2 * | 5/2013 | Hsu | ......................... G06F 1/187 312/223.2 |
| 8,454,101 | B2 * | 6/2013 | Kuo | ........................ A45C 5/03 220/377 |
| 8,764,073 | B2 * | 7/2014 | Lin | ....................... E05B 17/002 277/637 |
| 9,024,183 | B2 * | 5/2015 | Sakakura | ........... H01R 13/5202 174/50.5 |
| 9,390,746 | B2 * | 7/2016 | Lee | ........................ G11B 17/04 |

(Continued)

FOREIGN PATENT DOCUMENTS

DE  102015105271 B3 * 7/2016 ......... E05B 47/0603

*Primary Examiner* — Anatoly Vortman

(57) ABSTRACT

A door of an electronic device, adapted to cover an opening of the electronic device, includes a door body, a connection body and a soft body. The door body covers the opening and has a press margin. The press margin has a through hole and thereby is engaged with an engaging portion of the electronic device. The connection body is connected between the door body and the electronic device and bendable. The soft body is coupled inward to the door body and forms therein a water-resistant portion. The water-resistant portion is attached to the electronic device and corresponds in position to the opening, thereby rendering the door water-resistant. As soon as the press margin is pressed, the engaging portion gets movably restrained by the door body and thereby gets disengaged, thereby opening the door. The door dispenses with a switch structure and is dustproof, water-resistant, and intuitive to operate.

20 Claims, 9 Drawing Sheets

(56) References Cited

U.S. PATENT DOCUMENTS

| | | | | |
|---|---|---|---|---|
| 2011/0211300 A1* | 9/2011 | Mori | .................... | G06F 1/1656 |
| | | | | 361/679.01 |
| 2014/0368994 A1* | 12/2014 | Lee | ...................... | G06F 1/1656 |
| | | | | 361/679.55 |
| 2016/0122094 A1* | 5/2016 | Huang | ................. | G06F 1/1656 |
| | | | | 220/263 |

* cited by examiner

DOOR OF ELECTRONIC DEVICE

BACKGROUND OF THE INVENTION

Field of the Invention

The present invention relates to doors and, more particularly, to a door of an electronic device, with the door being dustproof and water-resistant (or waterproof).

Description of the Prior Art

Electronic devices, such as smartphones, tablets, and notebook computers, have to connect with peripheral devices and therefore must come with openings. Connectors mounted on a circuit board disposed in an electronic device are exposed from the openings to get inserted into and electrically connected to peripheral devices.

However, the openings, which the connectors are exposed from, are neither dustproof nor water-resistant. Dust that accumulates on the connectors exposed from the openings causes poor electrical connections. Furthermore, the connectors will rust and develop a short circuit when wetted by water that intrudes into the electronic device through the openings. The intrusion of water into the electronic device through the openings also causes the circuit board in the electronic device to develop a short circuit. In view of this, a door is required to cover the openings.

Although conventional doors serve to cover openings and thus are dustproof and water-resistant, the doors must come with switch structures in order to be opened and shut. However, the switch structures render the doors structurally complicated and add to the manufacturing costs of the doors.

Furthermore, the switch structures mounted on the conventional doors are not intuitive to operate, because users have to turn on the switches in order to open the doors by hand.

Accordingly, it is imperative to overcome the aforesaid drawbacks of the prior art.

SUMMARY OF THE INVENTION

It is an objective of the present invention to provide a door of an electronic device so that the door not only dispenses with a switch structure but is also dustproof, water-resistant (or waterproof), and intuitive to open and shut.

In order to achieve the above and other objectives, the present invention provides a door of an electronic device, adapted to cover an opening of the electronic device, with the opening having therein at least one engaging recess, the door comprising: a door body for covering the opening, with the door body having a press margin, wherein the press margin has at least one through hole and at least one engaging portion protruding and engaged with the at least one engaging recess; a connection body having a bend portion, with the bend portion connected to the door body, and the connection body fixed to the electronic device; and a soft body coupled to an inner side of the door body and forming a water-resistant portion, with the water-resistant portion attached to the electronic device and corresponding in position to the opening, thereby rendering the door water-resistant, wherein, as soon as the press margin partially exposed from the opening is pressed, the at least one engaging portion gets movably restrained by the door body and thereby exits the at least one engaging recess so that the door gets opened.

Compared with the prior art, the present invention has advantages as follows: the present invention provides a door of an electronic device so that the door not only dispenses with a switch structure but is also dustproof, water-resistant (or waterproof), and intuitive to open and shut with ease, not to mention that the door is structurally simple and incurs low manufacturing costs.

DETAILED DESCRIPTION OF THE EMBODIMENTS

The technical features of the present invention are illustrated with drawings and described below. However, the drawings are illustrative rather than restrictive of the present invention.

Figure 1:
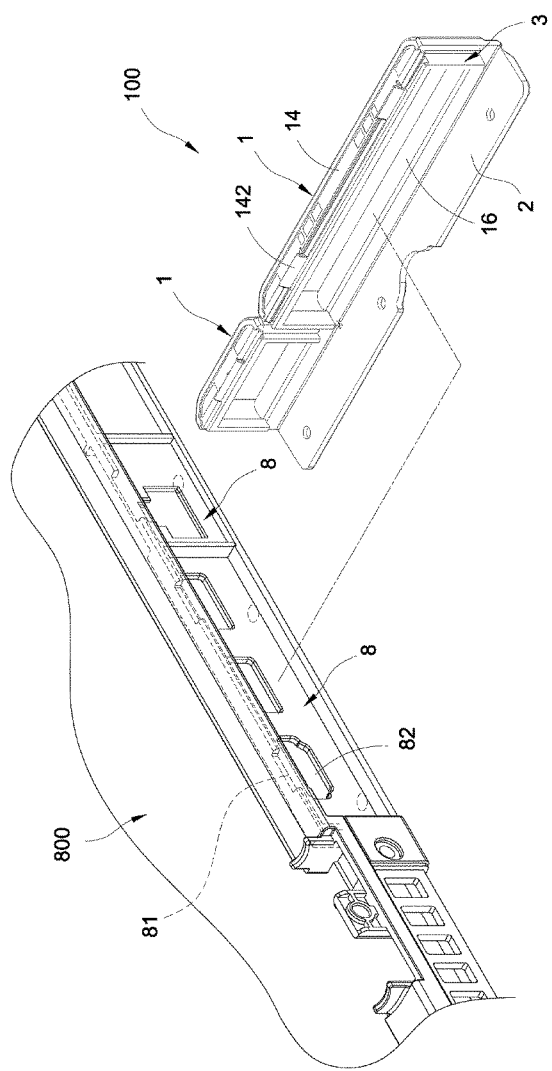
FIG. 1 is a perspective view of a door mounted in front of an electronic device according to the first embodiment of the present invention.
Figure 5:
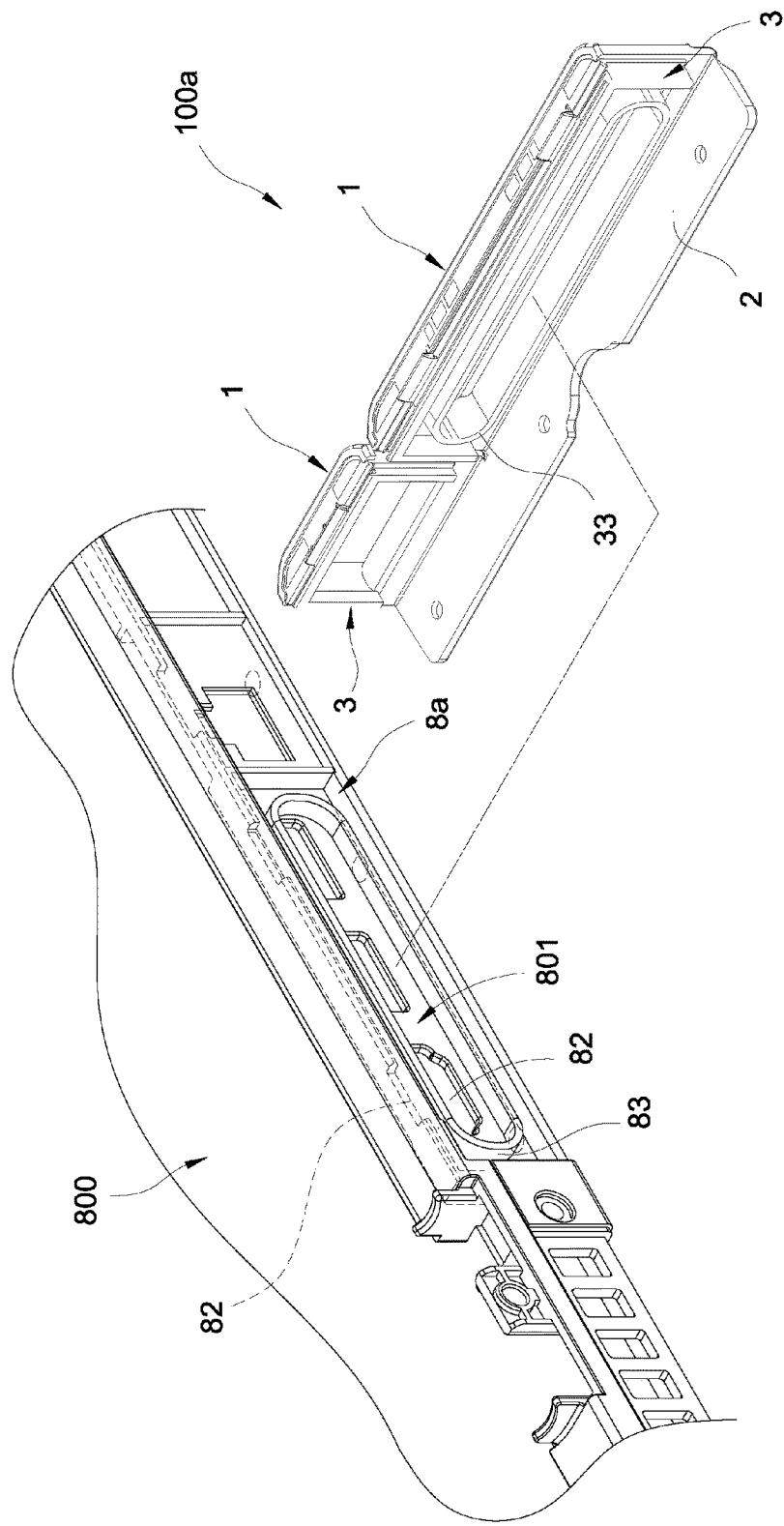
FIG. 5 is a perspective view of a door mounted in front of the electronic device according to the second embodiment of the present invention.
Figure 6:
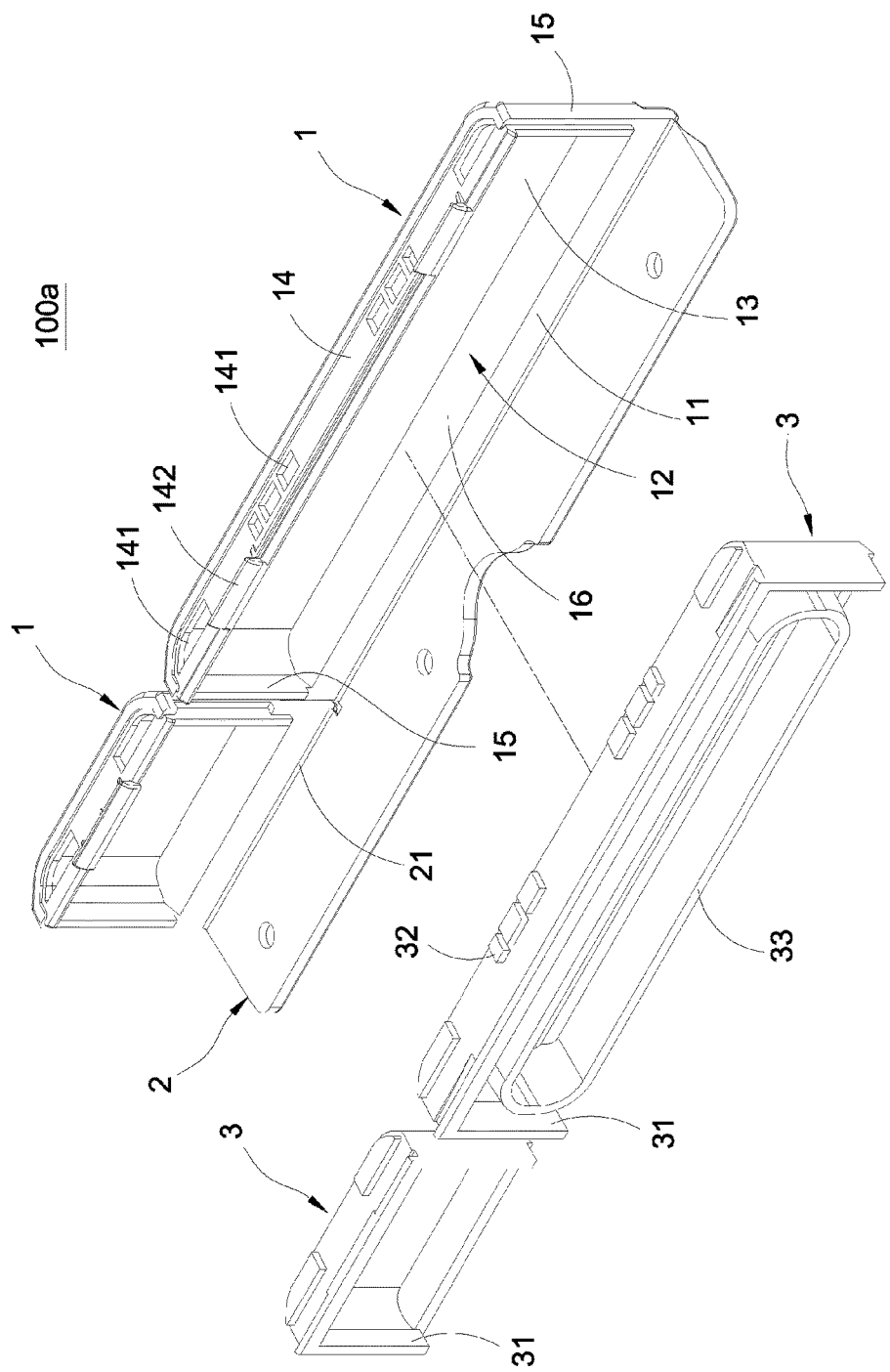
FIG. 6 is an exploded view of the door according to the second embodiment of the present invention.
Figure 7:
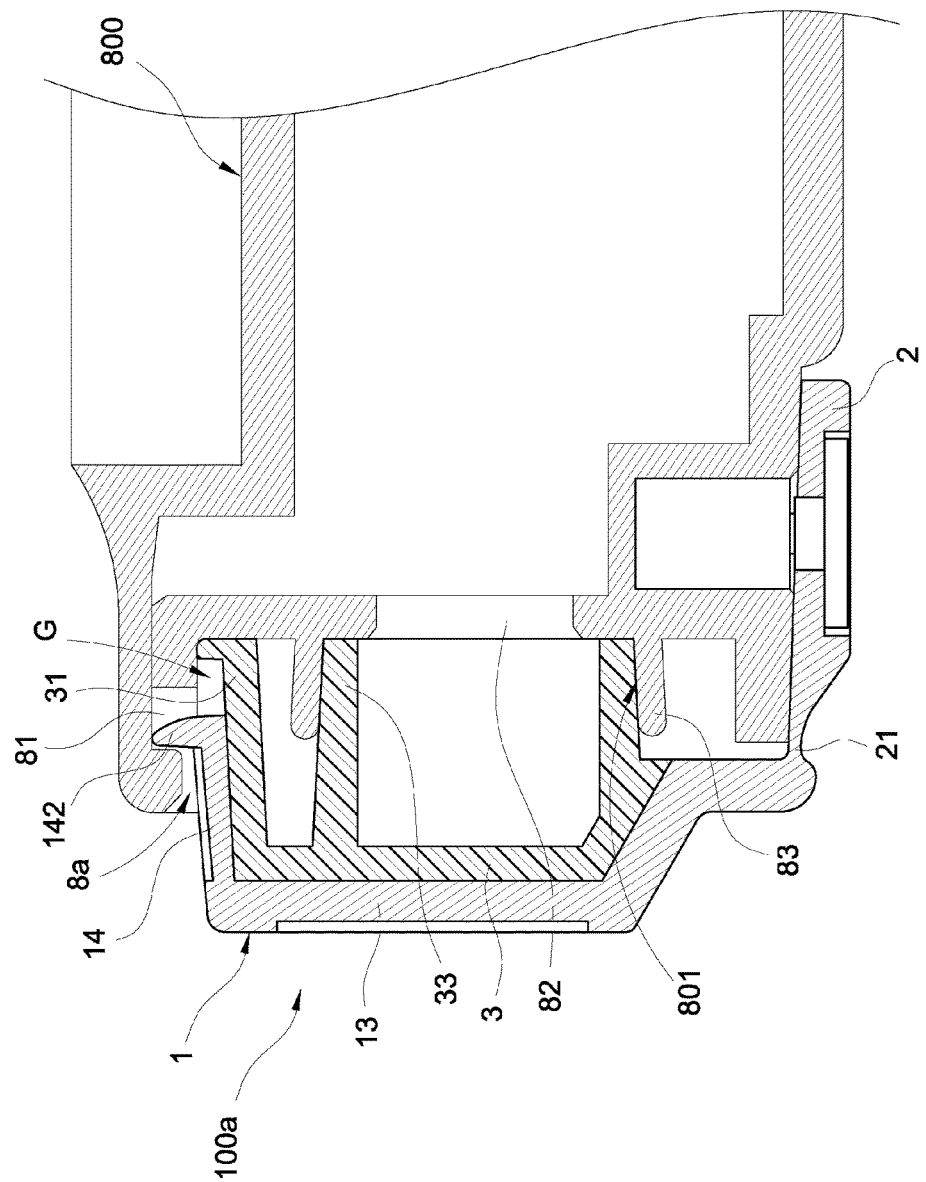
FIG. 7 is a cross-sectional view of FIG. 5 according to the present invention.
Figure 8:
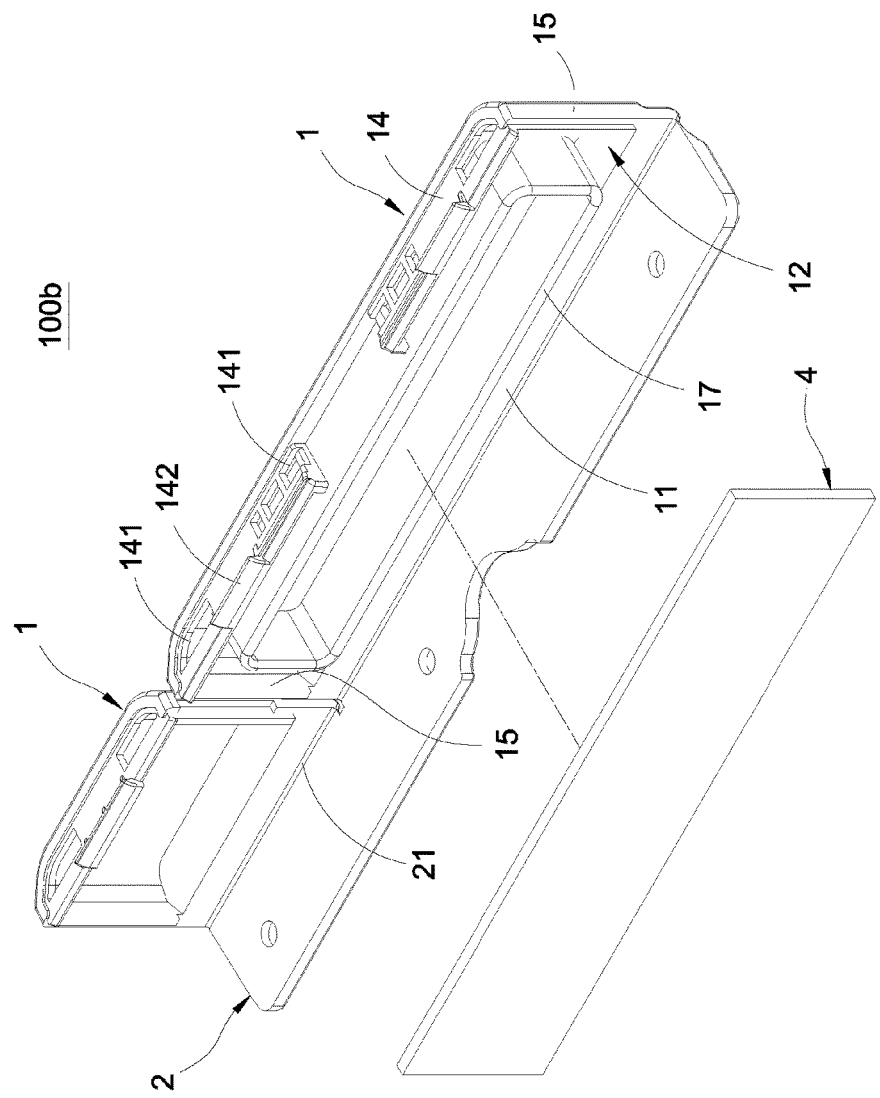
FIG. 8 is an exploded view of a door according to the third embodiment of the present invention.
Figure 9:
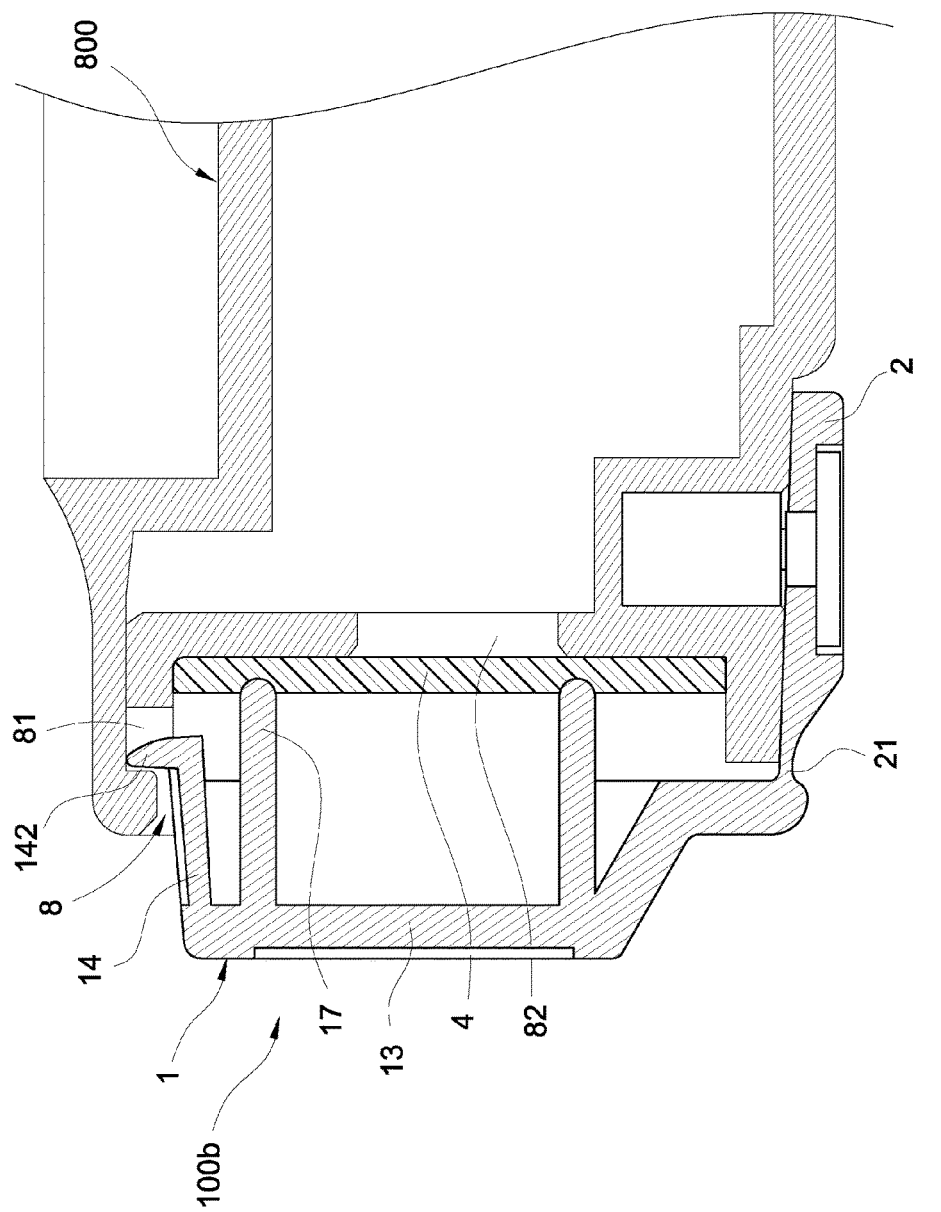
FIG. 9 is a cross-sectional view of the door mounted on the electronic device and shut according to the third embodiment of the present invention.

The present invention provides a door of an electronic device. FIG. 1 through FIG. 4 show a door according to the first embodiment of the present invention. FIG. 5 through FIG. 7 show a door according to the second embodiment of the present invention. FIG. 8 and FIG. 9 show a door according to the third embodiment of the present invention. Referring to FIG. 1, a door 100 of the present invention is capable of being opened and shut and adapted to cover an opening 8 of an electronic device 800 so as for the door 100 to be dustproof and water-resistant (or even waterproof). The door 100 is resistant to damage by water when water-resistant but impervious to water when waterproof; hence, being waterproof is more desirable than being water-resistant. The electronic device 800 has at least one opening 8, and each opening 8 has therein at least one engaging recess 81 and at least one admitting hole 82. In practice, the electronic device 800 has multiple openings 8, and each opening 8 has therein multiple engaging recesses 81 and multiple admitting holes 82.

Referring to FIG. 1, FIG. 2, FIG. 3 and FIG. 4, the door 100 provided according to the first embodiment of the present invention comprises a door body 1, a connection body 2, and a soft body 3.

The door body 1 is made of a hard material, such as a plastic, with a specific degree of deformation strength when an external force is exerted thereon. Since the door body 1 can be deformed to a certain extent, the door body 1 dispenses with a switch structure and covers the openings 8 of the electronic device 800 to render the door 100 dustproof. The door bodies 1 correspond in quantity to the openings 8 of the electronic device 800. Referring to FIG. 1, the electronic device 800 has two openings 8, and thus the door 100 has two door bodies 1.

The door body 1 has a press margin 14. At least one through hole 141 is disposed on the press margin 14. The through hole 141 is provided in the number of one or in the plural. The more the through holes 141, the more markedly the elastic deformation of the press margin 14. The press margin 14 further has at least one engaging portion 142 protruding and engaged with the at least one engaging recess 81, respectively. The at least one engaging portion 142 is provided in the number of one or in the plural. The longer the press margin 14, the more the engaging portions 142 are required, so as to preclude the loosening of the engaging portion-lacking part of the door body 1 when the door 100 is shut.

Figure 2:
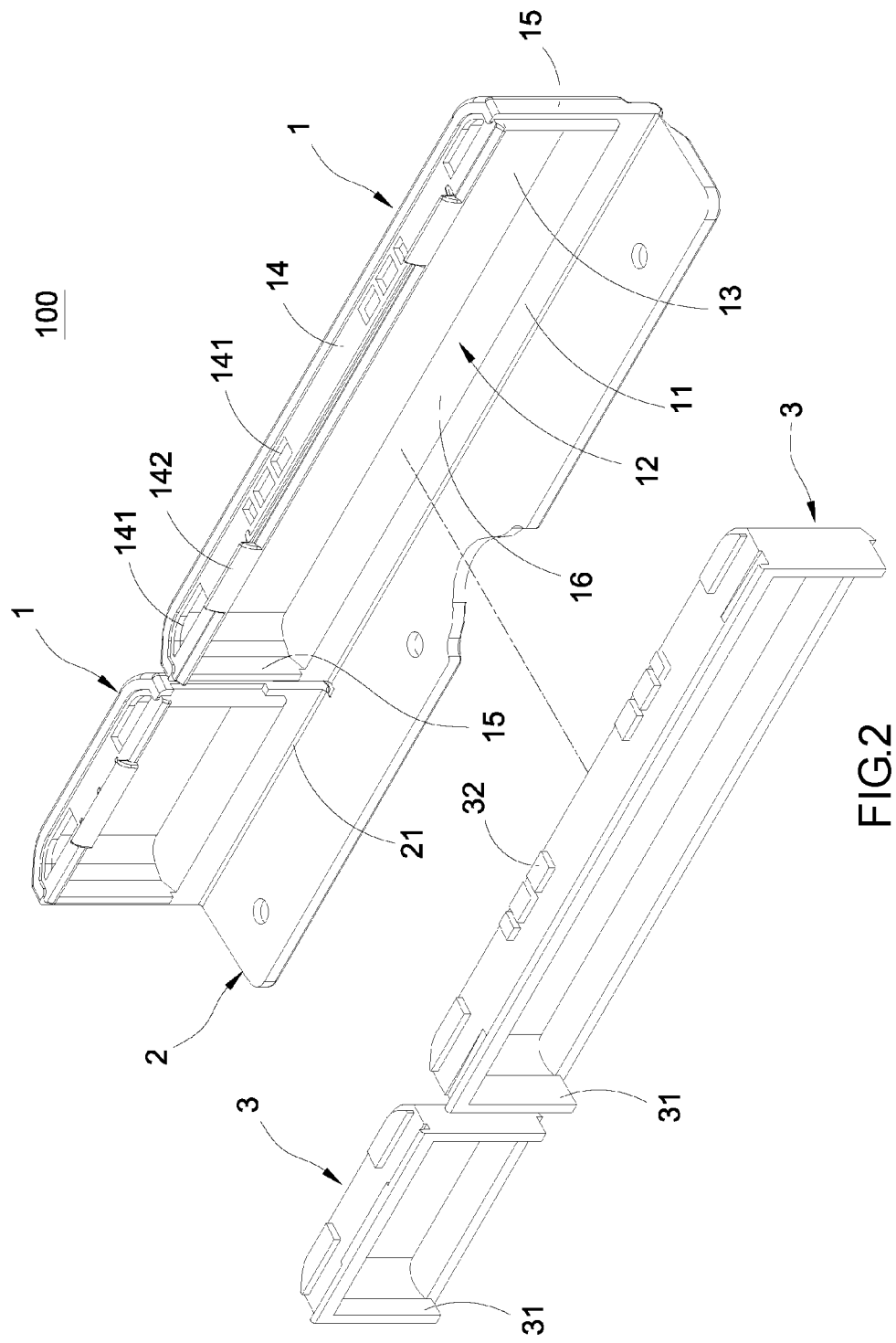
FIG. 2 is an exploded view of the door according to the first embodiment of the present invention.

The configuration between the through holes 141 and the engaging portions 142 on the door body 1 is intended to augment the elastic deformation of the press margin 14. In this embodiment, for illustrative sake, the through holes 141 and the engaging portions 142 are not aligned, as shown in FIG. 2.

The connection body 2 is also made of a hard material with a specific degree of deformation strength when an external force is exerted thereon, and the hard material is identical to or different from that of the door body 1. In this embodiment, the hard material is identical to that of the door body 1, and thus the connection body 2 is integrally connected to the door body 1. Moreover, the way of connecting the connection body 2 to the door body 1 is variable, for example, connecting one connection body 2 to one door body 1 (not shown), or connecting one connection body 2 to multiple door bodies 1 (shown in FIG. 2).

The connection body 2 has a bend portion 21 conducive to reciprocating bending. The outer side of the bend portion 21 adjoins the lower side of the door body 1. The connection body 2 is fixed to the electronic device 800 (shown in FIG. 4). Therefore, the door body 1 can be opened and shut because of the bending capacity of the bend portion 21.

The soft body 3 is made of a soft material, such as polyurethane (PU) or thermoplastic rubber (TPR), but the present invention is not limited thereto. The soft body 3 is coupled to and protruded from an inner side 11 of the door body 1, allowing the protrusion to form a water-resistant portion 31. Therefore, the water-resistant portion 31 is attached to the electronic device 800 and corresponds in position to the periphery (or rim) of the opening 8 so that the door 100 is rendered water-resistant. With the door 100 being water-resistant, water is shut out of the water-resistant portion 31 and thus cannot enter the opening 8. The water-resistant portion 31 comes in different shapes, but the present invention is not limited thereto. In this embodiment, for illustrative sake, the water-resistant portion 31 is inverted U-shaped, as shown in FIG. 2. Therefore, although the water-resistant portion 31 is not formed below the soft body 3, the door 100 remains water-resistant, because water cannot go upward against gravity.

Figure 3:
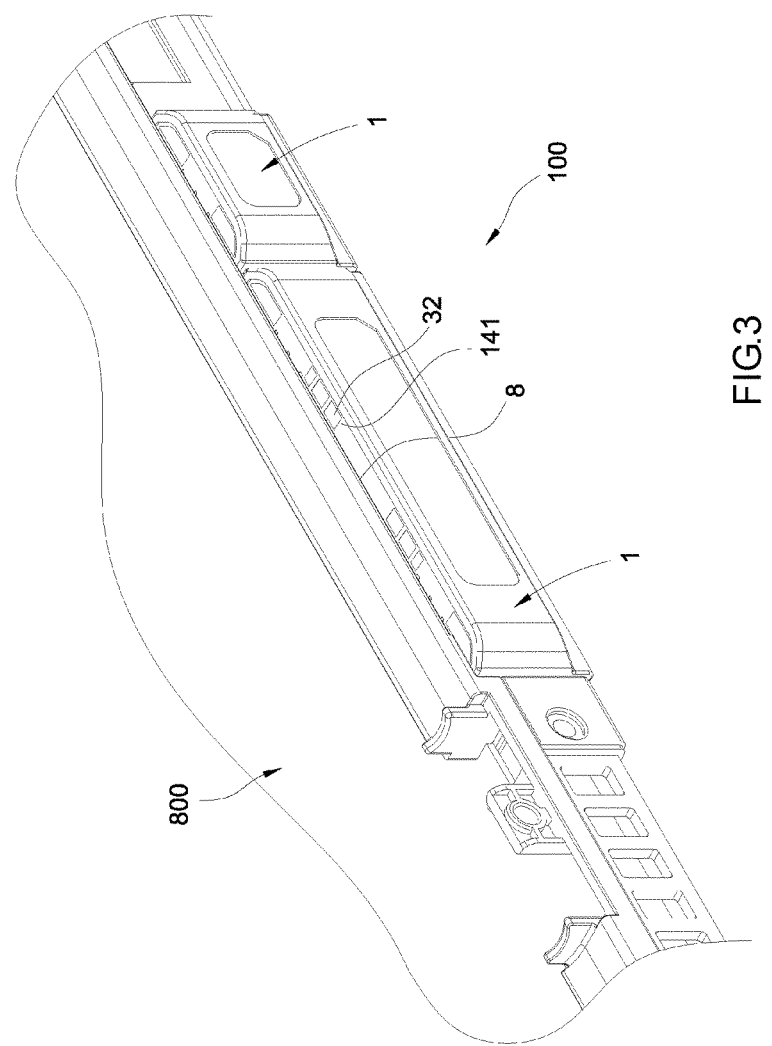
FIG. 3 is a perspective view of FIG. 1 according to the present invention.
Figure 4:
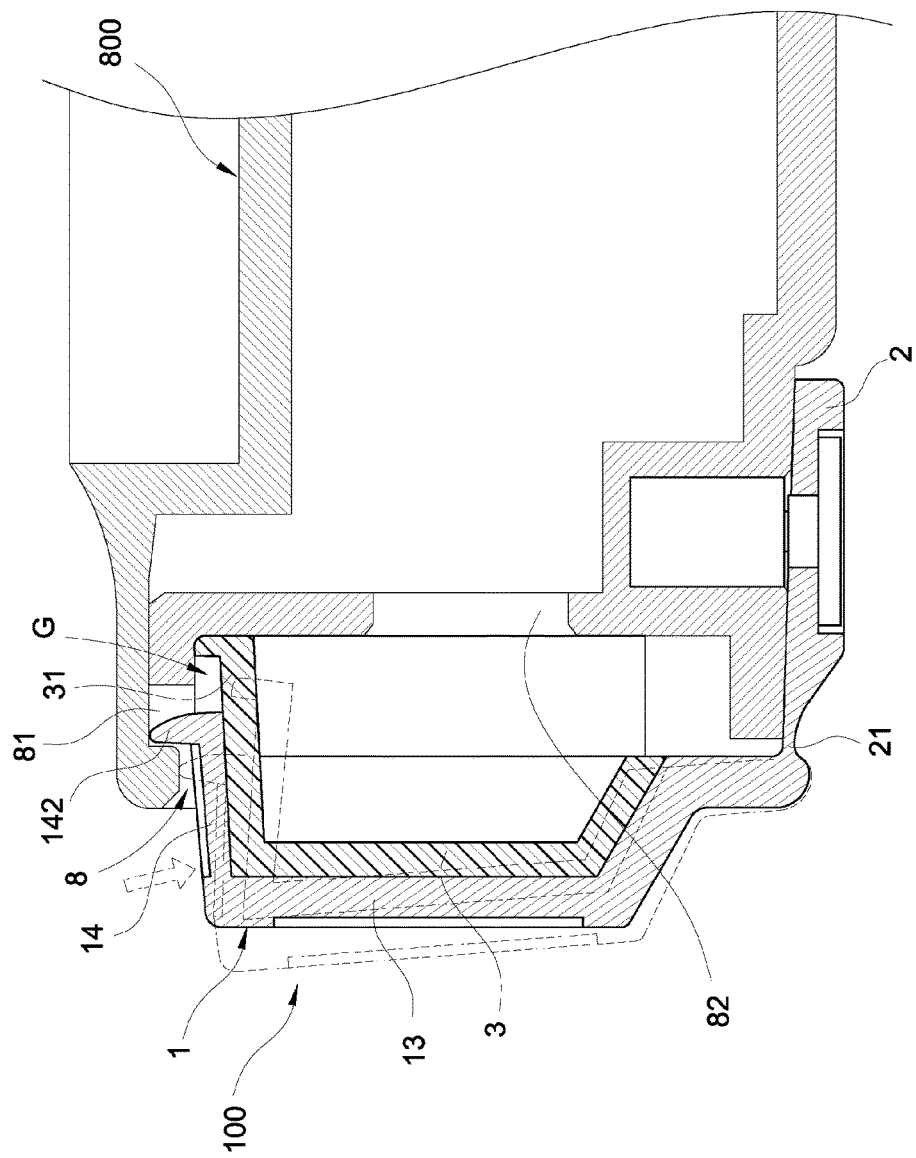
FIG. 4 is a cross-sectional view of FIG. 3 according to the present invention.

Referring to FIG. 3 and FIG. 4, when a user covers the opening 8 with the door 100, the engaging portions 142 get engaged with the engaging recesses 81, respectively, so that the door 100 is impermeable to dust when shut. The water-resistant portion 31 of the soft body 3 is attached to the electronic device 800 and corresponds in position to the periphery of the opening 8, thereby rendering the door 100 water-resistant. When the door 100 is shut, part of the press margin 14 of the door body 1 is partially exposed from the opening 8, as shown in FIG. 4. Therefore, part of the press margin 14 protrudes from the electronic device 800. Therefore, to open the door 100, the user presses the protrusion of the press margin 14 with a finger to not only enable the press margin 14 (or even the other part of the door body 1) to deform downward by the elastic deformation but also drive the engaging portions 142 to sink spontaneously and thereby exit (get disengaged from) the engaging recesses 81. Therefore, the door 100 can be opened easily and can dispense with any switch structure. Furthermore, to open the door 100, the user only needs to use a finger to press the press margin 14 in order to trigger disengagement. Similarly, to shut the door 100, the door 100 only needs to get engaged. Accordingly, the door 100 of the present invention is intuitive to open and shut with ease.

The structure of the door 100 of the present invention is described in detail below.

Referring to FIG. 2 and FIG. 4, the door body 1 has an outer panel 13 as well as the press margin 14 and multiple lateral sides 15, 16 which adjoin and enclose the outer panel 13 so that the inner side 11 of the door body 1 forms a hollowed-out portion 12. The hollowed-out portion 12 is disposed between the outer panel 13, the lateral sides 15, 16, and the press margin 14. Therefore, the press margin 14 hangs while corresponding in position to the hollowed-out portion 12, thereby facilitating elastic deformation.

The soft body 3 corresponds in shape to the hollowed-out portion 12 and extends in the direction from the outside to the inside of the opening 8 to form integrally the water-resistant portion 31 so that every part of the soft body 3 is fully coupled to the inside of the hollowed-out portion 12 of the door body 1 except the water-resistant portion 31. Since the soft body 3 corresponds in shape to the hollowed-out portion 12, the soft body 3 further has an outer panel (not denoted with any reference numeral) and multiple lateral sides (not denoted with any reference numeral) which adjoin and enclose the outer panel. The hollowed-out portion 12 is in communication with the through holes 141. Multiple bumps 32 corresponding in position to the through holes 141, respectively, are disposed on the soft body 3 so that the bumps 32 are confined to the through holes 141, respectively, to not only increase the strength of the coupling between the soft body 3 and the door body 1 but also enable the soft body 3 and the door body 1 to differ from each other in color and thereby look attractive.

Referring to FIG. 4, the press margin 14 tilts in the direction from the inner side 11 to the outer panel 13, that is, tilting from inside to outside, thereby allowing the water to be discharged in the tilt direction (to effectuate the first blockage of water). Moreover, the inner edge of the press margin 14 and the inner edge of the water-resistant portion 31 are spaced apart to form a gutter G so that water drainage occurs through the gutter G at a point thereof where the door 100 is the closest to the opening 8 (to effectuate the second blockage of water), thereby further rendering the door 100 water-resistant. The water-resistant portion 31 corresponds in position to the periphery of the opening 8 and abuts against the electronic device 800, thereby effectuating the third blockage of water.

Referring to FIG. 5, FIG. 6 and FIG. 7, a door 100a is provided according to the second embodiment of the present invention. The second embodiment is similar to the first embodiment except that, in the second embodiment, an enclosure body 33 is disposed on the soft body 3. The inner side of the soft body 3 extends in the direction from the outside to the inside of the opening 8 to form integrally the enclosure body 33.

In the second embodiment, an entrance 801 is disposed in an opening 8a of the electronic device 800, whereas all the admitting holes 82 are disposed in the entrance 801. An enclosure flange 83 is protrudingly disposed in the opening 8a of the electronic device 800 and adapted to define the entrance 801.

As soon as the door 100a is shut, the enclosure body 33 enters the entrance 801 in the opening 8a. Even though the water closes in on the door 100a, the water is shut out of the door 100a by the enclosure body 33 and the entrance 801 which fit each other snugly, thereby waterproofing the door 100a. Therefore, the door 100a in the second embodiment is dustproof and brings the first type of waterproofing effect, whereas the door 100 in the first embodiment is merely dustproof and water-resistant.

Referring to FIG. 8 and FIG. 9, a door 100b is provided according to the third embodiment of the present invention. The third embodiment is similar to the first embodiment, except that the door body 1 comes with an enclosure body 17 and a soft body 4 in the third embodiment.

The door 100b comprises a door body 1, a connection body 2 and a soft body 4. Like the first embodiment, the third embodiment features the door body 1 and the connection body 2. The third embodiment is distinguished from the first embodiment in that the third embodiment is characterized in that an enclosure body 17 is protrudingly disposed on the door body 1, wherein the material which the enclosure body 17 is made of is different from the material which the door body 1 is made of (not shown). In the third embodiment, for illustrative sake, the enclosure body 17 integrally protrudes from the inner side of the outer panel 13 and extends inward (shown in FIG. 9), and thus the door body 1, connection body 2 and enclosure body 17 are made of a hard material with a specific degree of deformation strength when an external force is exerted thereon.

The soft body 4 is made of a soft material, such as polyurethane (PU) or thermoplastic rubber (TPR), but the present invention is not limited thereto. The soft body 4 is disposed between the door body 1 and the electronic device 800. Therefore, as soon as the door body 1 covers the opening 8 (see FIG. 9), the enclosure body 17 not only abuts against the outer surface of the soft body 4 spontaneously but also forces the inner side of the soft body 4 to cover the opening 8, thereby rendering the door 100b waterproof. Therefore, the door 100b in the third embodiment is dustproof and brings the second type of waterproofing effect. The soft body 4 is a pad as shown in the diagram and is disposed on the enclosure body 17, but the present invention is not limited thereto.

Preferably, all the admitting holes 82 of the electronic device 800 fall within the precincts of the enclosure body 17 (shown in FIG. 9) to prevent the water from intruding into the soft body 4 through a part thereof which the enclosure body 17 abuts against and is in tight fit with, thereby rendering the door 100b waterproof.

In conclusion, the present invention has advantages over the prior art, because the door of an electronic device according to the present invention dispenses with a switch structure, is dustproof, water-resistant (or waterproof) and structurally simple, and incurs low manufacturing costs, not to mention that the doors 100, 100a, 100b are intuitive to open and shut with ease.

The present invention is disclosed above by preferred embodiments. However, the preferred embodiments are not restrictive of the scope of the claims of the present invention. All equivalent structurally changes made to the preferred embodiments and drawings of the present invention should fall within the scope of the claims of the present invention.

What is claimed is:

1. A door of an electronic device, adapted to cover an opening of the electronic device, with the opening having therein at least one engaging recess, the door comprising:
   a door body for covering the opening, with the door body having a press margin, wherein the press margin has at least one through hole and at least one engaging portion protruding and engaged with the at least one engaging recess;
   a connection body having a bend portion, with the bend portion connected to the door body, and the connection body fixed to the electronic device; and
   a soft body coupled to an inner side of the door body and forming a water-resistant portion, with the water-resistant portion attached to the electronic device and corresponding in position to the opening, thereby rendering the door water-resistant,
   wherein, as soon as the press margin partially exposed from the opening is pressed, the at least one engaging portion gets movably restrained by the door body and thereby exits the at least one engaging recess so that the door gets opened.

2. The door of an electronic device according to claim 1, wherein the soft body is made of a soft material, and the soft material is one of polyurethane (PU) and thermoplastic rubber (TPR).

3. The door of an electronic device according to claim 2, wherein the door body and the connection body are made of a hard material with a specific degree of deformation strength when an external force is exerted thereon.

4. The door of an electronic device according to claim 1, wherein the at least one engaging portion and the at least one through hole are not aligned.

5. The door of an electronic device according to claim 1, wherein the press margin tilts in a direction from the inner side to an outer side of the door body, with the outer side opposing the inner side.

6. The door of an electronic device according to claim 1, wherein an inner edge of the press margin and an inner edge of the water-resistant portion are spaced apart to form a gutter.

7. The door of an electronic device according to claim 1, wherein the water-resistant portion is attached to the electronic device and corresponds in position to a periphery of the opening.

8. The door of an electronic device according to claim 1, wherein the inner side of the door body forms a hollowed-out portion, and the press margin hangs while corresponding in position to the hollowed-out portion, with the soft body coupled to an inside of the hollowed-out portion.

9. The door of an electronic device according to claim 8, wherein the door body has an outer panel as well as the press margin and lateral sides which adjoin and enclose the outer panel, whereas the hollowed-out portion is disposed between the outer panel, the lateral sides, and the press margin.

10. The door of an electronic device according to claim 8, wherein the hollowed-out portion is in communication with the at least one through hole, and at least one bump is disposed on the soft body to correspond in position and be confined to the at least one through hole.

11. The door of an electronic device according to claim 8, wherein the soft body corresponds in shape to the hollowed-out portion and extends in a direction from the outside to the inside of the opening to form integrally the water-resistant portion.

12. The door of an electronic device according to claim 8, wherein the soft body extends to form an enclosure body which enters an entrance in the opening, thereby waterproofing the door.

13. A door of an electronic device, adapted to cover an opening of the electronic device, with the opening having therein at least one engaging recess, the door comprising:
- a door body for covering the opening, with the door body having a press margin, wherein the press margin has at least one through hole and at least one engaging portion protruding and engaged with the at least one engaging recess, with an enclosure body protrudingly disposed on an inner side of the door body;
- a connection body having a bend portion, with the bend portion connected to the door body, and the connection body fixed to the electronic device; and
- a soft body disposed between the door body and the electronic device and having a surface being abutted against by the enclosure body so that another opposing surface of the soft body is forced to cover the opening, thereby rendering the door waterproof, wherein, as soon as the press margin partially exposed from the opening is pressed, the at least one engaging portion gets movably restrained by the door body and thereby exits the at least one engaging recess so that the door gets opened.

14. The door of an electronic device according to claim 13, wherein the soft body is made of a soft material, and the soft material is one of polyurethane (PU) and thermoplastic rubber (TPR).

15. The door of an electronic device according to claim 14, wherein the door body and the connection body are made of a hard material with a specific degree of deformation strength when an external force is exerted thereon.

16. The door of an electronic device according to claim 13, wherein the at least one engaging portion and the at least one through hole are not aligned.

17. The door of an electronic device according to claim 13, wherein the press margin tilts in a direction from the inner side to an outer side of the door body, with the outer side opposing the inner side.

18. The door of an electronic device according to claim 13, wherein the inner side of the door body forms a hollowed-out portion, and the press margin hangs while corresponding in position to the hollowed-out portion, with the enclosure body disposed in the hollowed-out portion.

19. The door of an electronic device according to claim 18, wherein the door body has an outer panel as well as the press margin and lateral sides which adjoin and enclose the outer panel, whereas the hollowed-out portion is disposed between the outer panel, the lateral sides, and the press margin, with the enclosure body protruding from the outer panel integrally.

20. The door of an electronic device according to claim 18, wherein the hollowed-out portion is in communication with the at least one through hole.

* * * * *